United States Patent
Doi et al.

(10) Patent No.: US 9,034,151 B2
(45) Date of Patent: May 19, 2015

(54) ALIGNMENT FILM FORMING APPARATUS AND METHOD

(75) Inventors: Shoichi Doi, Shiga (JP); Tatsuya Nishiwaki, Shiga (JP)

(73) Assignee: International Business Machines Corporation, Armonk, NY (US)

( * ) Notice: Subject to any disclaimer, the term of this patent is extended or adjusted under 35 U.S.C. 154(b) by 1651 days.

(21) Appl. No.: 12/174,897

(22) Filed: Jul. 17, 2008

(65) Prior Publication Data

US 2009/0050469 A1   Feb. 26, 2009

(30) Foreign Application Priority Data

Aug. 22, 2007   (JP) .................................. 2007-215494

(51) Int. Cl.
  C23C 14/00   (2006.01)
  C23C 14/32   (2006.01)
  (Continued)

(52) U.S. Cl.
  CPC ........... *C23C 14/3442* (2013.01); *C23C 14/221* (2013.01); *C23C 14/0605* (2013.01); *H01J 37/3411* (2013.01); *H01J 2237/3146* (2013.01); *H01J 37/3426* (2013.01);
  (Continued)

(58) Field of Classification Search
  CPC .............. C23C 14/3442; C23C 14/221; C23C 14/0605; C23C 14/042; C23C 14/225; C23C 14/46; H01J 37/3411; H01J 37/3426; H01J 2237/3146
  USPC ............. 204/192.11, 298.04, 298.09, 192.15, 204/298.12, 298.23, 298.24
  See application file for complete search history.

(56) References Cited

U.S. PATENT DOCUMENTS 4,911,809 A * 3/1990 Wort et al. ............... 204/192.11
5,080,455 A * 1/1992 King et al. .................... 359/350
(Continued)

FOREIGN PATENT DOCUMENTS

JP   02015161 A * 1/1990
JP   03006373 A * 1/1991
(Continued)

OTHER PUBLICATIONS

Machine Translation—JP11271774.*
(Continued)

*Primary Examiner* — Michael Band
(74) *Attorney, Agent, or Firm* — Schmeiser, Olsen & Watts LLP; John Pivnichny

(57) ABSTRACT

An alignment film forming apparatus and a method are provided to form an alignment film for a liquid crystal in a single process of simultaneously executing a film deposition process of ion beam sputtering and an alignment process. The method greatly restricts the size of a substrate. An alignment film forming apparatus includes a target disposed on a top surface side of a substrate and having a sputtering surface defining a sharp angle to the top surface of the substrate, a transfer table that transfers the substrate in a predetermined direction, and an ion source disposed on the top surface side of the substrate in such a way that an ion beam is irradiated on the sputtering surface of the target. An ion beam reflected at the sputtering surface is irradiated on a sputtering film formed on the substrate. The apparatus includes a mask disposed in such a way as to cover a part of the top surface of the substrate on an upstream side of a position where the sputtering film is formed, and a temperature regulator which regulates the temperature of the target.

6 Claims, 2 Drawing Sheets

(51) Int. Cl.

| | | |
|---|---|---|
| *C25B 9/00* | (2006.01) | |
| *C25B 11/00* | (2006.01) | |
| *C25B 13/00* | (2006.01) | |
| *C23C 14/34* | (2006.01) | |
| *C23C 14/06* | (2006.01) | |
| *H01J 37/34* | (2006.01) | |
| *C23C 14/04* | (2006.01) | |
| *C23C 14/46* | (2006.01) | |
| *G02F 1/1337* | (2006.01) | |
| *C23C 14/22* | (2006.01) | |

(52) U.S. Cl.
CPC ............ *C23C 14/042* (2013.01); *C23C 14/225* (2013.01); *C23C 14/46* (2013.01); *G02F 1/133734* (2013.01)

(56) References Cited

U.S. PATENT DOCUMENTS

| | | | | |
|---|---|---|---|---|
| 5,454,919 | A | * | 10/1995 | Hill et al. .................. 204/192.11 |
| 5,770,826 | A | | 6/1998 | Chaudhari et al. |
| H0001933 | H | * | 1/2001 | Zabinski et al. ......... 204/298.26 |
| 6,593,586 | B2 | | 7/2003 | Chaudhari et al. |
| 6,632,483 | B1 | | 10/2003 | Callegari et al. |
| 6,783,635 | B2 | * | 8/2004 | Pinarbasi .................. 204/192.11 |
| 7,184,116 | B2 | | 2/2007 | Kamiya et al. |
| 7,525,107 | B2 | | 4/2009 | Nakagaki et al. |
| 2002/0005347 | A1 | * | 1/2002 | Sferlazzo et al. .......... 204/192.1 |

FOREIGN PATENT DOCUMENTS

| | | | |
|---|---|---|---|
| JP | 11271774 | A * | 10/1999 |
| JP | 2000192235 | A * | 7/2000 |
| JP | 2003-222873 | | 8/2003 |
| JP | 2004205586 | | 7/2004 |
| JP | 2005-084145 | | 3/2005 |
| JP | 2006-047724 | | 2/2006 |
| JP | 2006227533 | | 8/2006 |
| JP | 2006-284887 | | 10/2006 |
| JP | 2007163711 | | 6/2007 |
| WO | WO 9810115 | A1 * | 3/1998 |

OTHER PUBLICATIONS

Machine Translation—JP 2000192235.*
U.S. Appl. No. 14/628,356, filed Feb. 23, 2015, Conf. No. 6607.

* cited by examiner

ALIGNMENT FILM FORMING APPARATUS AND METHOD

FIELD OF THE INVENTION

The present invention relates to an alignment film forming apparatus and method, and more particularly, to an alignment film forming apparatus and method which form an alignment film for a liquid crystal on a substrate using ion beam sputtering.

BACKGROUND OF THE INVENTION

A liquid crystal display is configured to have a liquid crystal held between transparent substrates of glass or the like. An alignment film is formed on each transparent substrate. The alignment film serves to align liquid crystal molecules in a predetermined direction, and is formed by applying a film of polyimide or the like and rubbing the film in one direction with a buff cloth. Rubbing is the most ordinary alignment scheme but with this technique it is difficult to provide uniform orientation while easily providing strong alignment restricting force.

An ion beam method is receiving attention as a new alignment technique in place of the rubbing method. The ion beam method provides alignment by accelerating ions of argon or the like with high voltage and irradiating an ion beam on a film of DLC (Diamond Like Carbon) or the like in an oblique direction. Contrary to the rubbing method, when using the ion beam method it is difficult to provide strong alignment restricting force while easily providing uniform orientation.

In case of forming an alignment film by the ion beam method, film deposition and alignment are separate processes (see Patent Documents 1 to 3 mentioned below). Therefore, two apparatuses, a film deposition apparatus and an alignment apparatus, are needed. This raises various problems, such as making the overall apparatus more expensive, the need for a wider apparatus installing space and the need for a rinsing process between the film deposition process and the alignment process.

For example, Japanese Unexamined Patent Publication (Kokai) No. 2003-222873 describes a method of executing an alignment process by forming a DLC film with magnetron sputtering, and then irradiating an argon ion beam on the DLC film while transferring a substrate. Japanese Unexamined Patent Publication (Kokai) No. 2006-047724 describes a method of executing an alignment process by irradiating an ion beam on a DLC film while transferring a substrate, but fails to give a detailed description of a film deposition process. In addition, an apparatus described in Patent Document 2 transfers a substrate from an upstream side to a downstream side, with masks provided on both the upstream and downstream sides. Japanese Unexamined Patent Publication (Kokai) No. 2006-284887 describes a method of executing an alignment process by forming a DLC film with plasma sputtering or CVD (Chemical Vapor Deposition) and then irradiating an ion beam on the DLC film while transferring a substrate.

Japanese Unexamined Patent Publication (Kokai) No. 2005-084145 (the 084145) describes a method of forming an alignment film in a single process of simultaneously executing a film deposition process and an alignment process by using ion beam sputtering. According to the method, an ion beam is irradiated on a target such as $SiO_2$, so that sputtering particles sputtered from the target are irradiated on a substrate at an incidence angle $\theta s$. As a result, a columnar crystal is grown in a direction tilted by $\theta s$, thereby forming an alignment film. However, this method can form an alignment film only on a relatively small substrate. This is because with the positional relationship shown in the publication, a substrate if large, blocks an ion beam irradiated on a target from an ion source. In general, an ion beam and sputtering particles generated by the ion beam have certain spread irradiation ranges, which become wider because the distance between the ion source and the target is long according to the disclosed invention. Although paragraph 0036 of the 084145 document suggests movement of a substrate in such a way that the incidence angle becomes $\theta s$ wile irradiating sputtering particles, it appears from the foregoing circumstance that an alignment film shall be formed only on a very small substrate.

Japanese Unexamined Patent Publication (Kokai) No. 2002-062532 describes a method of forming an alignment film in a single process of a simultaneously executing a film deposition process and alignment process by using ion beam sputtering. According to the method, a substrate is bombarded with an ion beam at a predetermined incidence angle, and at the same time, while a film is deposited on the substrate, the atomic structure of the film is aligned in a predetermined alignment direction, but no sputtering is performed.

Japanese Unexamined Patent Publication (Kokai) No. 2002-055348 describes a method of forming an alignment film in a single process of simultaneously executing a film deposition process and an alignment process by using magnetron sputtering. According to the method, a carbon film is deposited on a substrate with a magnetic field acting thereon, but no ion beam is used.

SUMMARY OF THE INVENTION

According to an embodiment of the present invention, there is provided an apparatus for forming an alignment film on a substrate using ion beam sputtering, comprising a target disposed on a first surface side of the substrate, the target having a sputtering surface defining an angle relative to the first surface side of the substrate, a transfer unit adapted to transfer the substrate in a direction opposite to a direction in which a normal direction of the sputtering surface is projected on the first surface side of the substrate, and an ion source disposed on the first surface side of the substrate in such a way that when an ion beam is irradiated on the sputtering surface of the target, the ion beam reflected at the sputtering surface is irradiated on a sputtering film formed on the substrate.

According to another embodiment of the present invention, there is provided a method for forming an alignment film on a substrate by using ion beam sputtering, comprising the steps of disposing a target on a first surface side of the substrate in such a way that a sputtering surface of the target defines an angle with the first surface side of the substrate, disposing an ion source that generates an ion beam on the first surface side of the substrate, and causing the ion source to irradiate an ion beam on the sputtering surface of the target and irradiating an ion beam reflected at the sputtering surface on a sputtering film formed on the substrate while transferring the substrate in a direction opposite to a direction in which a normal direction of the sputtering surface is projected on the first surface side of the substrate.

DETAILED DESCRIPTION OF THE INVENTION

Figure 1:
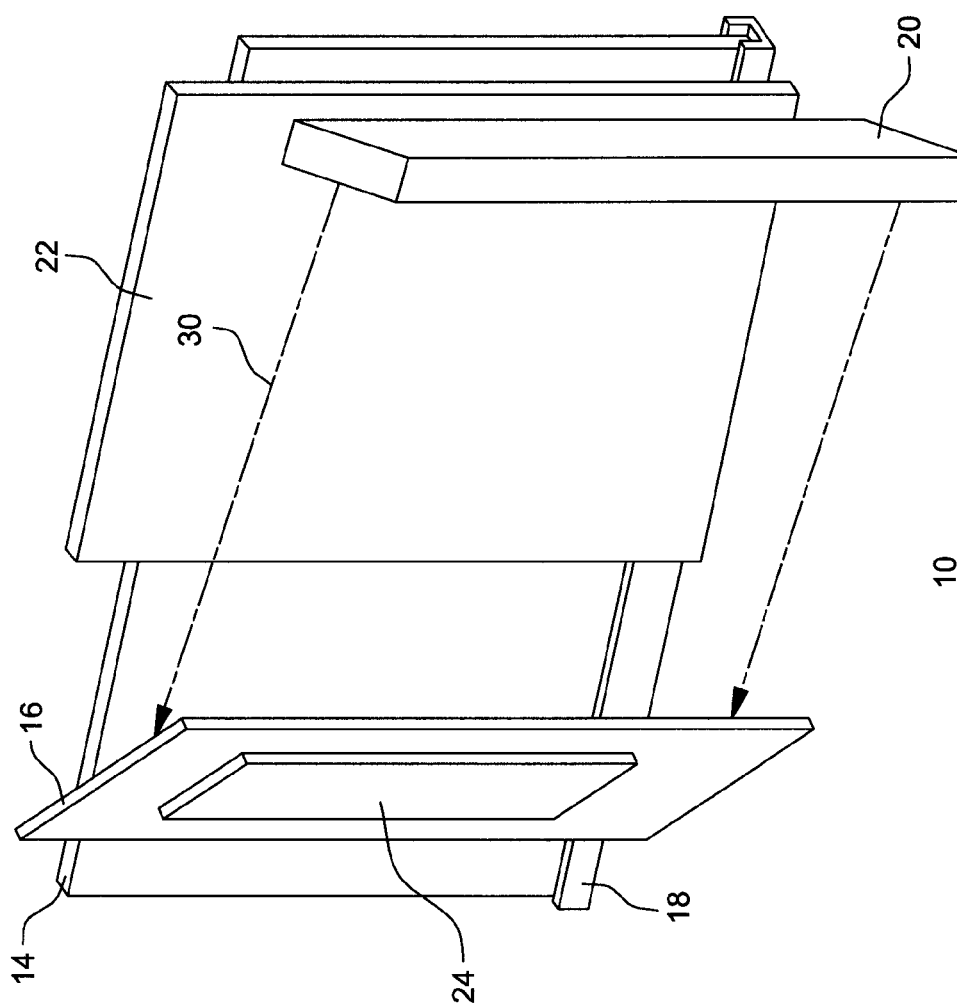
FIG. 1 is a perspective view showing the configuration of an alignment film forming apparatus according to one embodiment of the present invention.

An embodiment of the present invention will be described in detail below by referring to the accompanying drawings. Same reference numerals are given to like or same components in the diagrams to avoid repeating their redundant descriptions.

Figure 2:
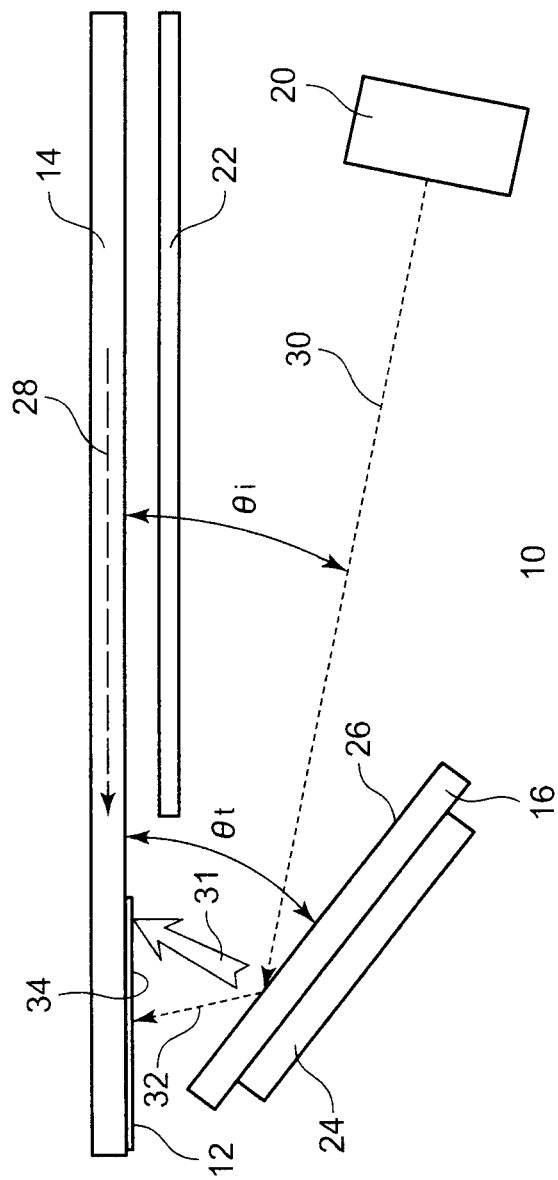
FIG. 2 is a top view of the alignment film forming apparatus shown in FIG. 1.

Referring to FIGS. 1 and 2, an alignment film forming apparatus 10 according to one embodiment of the present invention forms an alignment film 12 for a liquid crystal on a substrate 14 by using ion beam sputtering. Alignment film forming apparatus 10 has a target 16, a transfer table 18, an ion source 20, a mask 22 and a temperature regulator 24. Target 16, ion source 20, mask 22 and temperature regulator 24 are secured in a vacuum chamber (not shown). Transfer table 18 is provided in the vacuum chamber in a movable manner. The degree of vacuum of the vacuum chamber is about $2 \times 10^{-2}$ Pa, for example. Substrate 14 has a rectangular shape of, for example, about 340 mm×470 mm, and has a transparent electrode of ITO (Indium Tin Oxide) or the like formed on a glass substrate.

Target 16 is disposed on or above the top surface side of substrate 14. A sputtering surface 26 of target 16 defines a sharp angle (hereinafter called "target angle") $\theta t$ to the top surface of substrate 14. Target angle $\theta t$ is preferably equal to or less than about 60 degrees. Target 16 can be formed of a material containing graphite, carbon or polyimide.

Transfer table 18 transfers substrate 14 in a direction 28 different from the direction in which the normal direction of sputtering surface 26 is projected on the top surface of substrate 14. Transfer table 18 has a recessed lateral cross section and holds the bottom side portion of substrate 14. A columnar roller (not shown) is rotatably provided at the bottom side of transfer table 18, so that the transfer table is movable in the lengthwise direction. A holder (not shown) which holds the top side portion of substrate 14 is provided, so that the substrate stands stably upright in the vertical direction.

Ion source 20 is disposed on or above the top surface side of substrate 14 to irradiate an ion beam 30 on sputtering surface 26 of target 16. When ion beam 30 is irradiated on target 16, sputtering particles 31 are sputtered from the target and deposited on substrate 14, thereby forming a DLC sputtering film 34. Ion source 20 is disposed in such a way that an ion beam 32 is reflected at sputtering surface 26 irradiating sputtering film 34 formed on substrate 14. It is preferable that an irradiation angle $\theta i$ should be equal to or less than about 45 degrees and equal to or less than the target angle $\theta t$, and a particularly suitable irradiation angle is about 25 degrees. Ion source 20 can generate a belt-like ion beam equal to or wider than the width of substrate 14; for example, a Veeco-Ion Tech's linear type argon ion source. An acceleration voltage is preferably about 1500 V or lower, and a particularly suitable acceleration voltage is about 800 V. When acceleration voltage is high, the alignment restricting force becomes weaker. When the acceleration voltage exceeds about 1500 V, sputtering film 34 may be cut off. The ion beam can comprise argon or nitrogen.

Mask 22 is disposed in such a way as to cover a part of the top surface of substrate 14 on an upstream side of a position where the sputtering film is formed. Even if ion beam 30 is scattered, the ion beam is not irradiated on the upstream side of substrate 14.

Temperature regulator 24 regulates the temperature of target 16. Temperature regulator 24 is disposed in contact with the back side of sputtering surface 26. Because the amount of sputtering particles 31 vary according to the temperature of target 16, temperature regulator 24 keeps the target at a predetermined temperature (e.g., 100° C.) by directly supplying heat to the target. Temperature regulator 24 includes a heater, such as a nichrome wire, a temperature sensor and a PID (Proportional-Integral-Derivative) control circuit. Temperature regulator 24 may serve as a target holder to hold target 16. While temperature regulator 24 is disposed in contact with the back side of sputtering surface 26, the temperature regulator may be disposed apart from the target, so that radiant heat, such as infrared radiation, is supplied to the target.

Next, a method of forming alignment film 12 for a liquid crystal on substrate 14 using alignment film forming apparatus 10 will be described.

First, substrate 14 is placed on transfer table 18, transferred into the vacuum chamber, and transferred in predetermined direction 28 little by little.

Then, ion source 20 irradiates ion beam 30 onto sputtering surface 26 of target 16. Accordingly, sputtering particles 31 sputtered from target 16 are deposited on substrate 14, thereby forming sputtering film 34. As substrate 14 is transferred in predetermined direction 28, ion beam 32 reflected at sputtering surface 26 is irradiated on to sputtering film 34 formed on the substrate. This allows sputtering film 34 to have an orientation. When ion beam 30 is kept irradiated on target 16 while transferring substrate 14, alignment film 12 is formed on the entire top surface of the substrate. Then, substrate 14 whose film deposition has been completed is removed from the vacuum chamber.

According to the embodiment of the present invention, as described above, alignment film 12 can be formed in a single process by simultaneously executing the film deposition process and the alignment process. Both target 16 and ion source 20 are disposed above the surface of substrate 14. Target 16 is disposed in such a way that sputtering surface 26 defines sharp angle $\theta t$ to the top surface of substrate 14. Ion source 20 irradiates ion beam 30 on sputtering surface 26 of target 16, and ion beam 32 reflected at the sputtering surface is irradiated on sputtering film 34 formed on the substrate, so that the substrate does not block the ion beam irradiated on the target from the ion source. Accordingly, the size of substrate 14 is hardly restricted.

The ion beam method can provide alignment restricting force similar to that provided by the rubbing method, and can provide a more uniform orientation than the rubbing method.

While single irradiation of an ion beam is normally sufficient, if irradiation of an ion beam is performed multiple times with alignment film 12 held in vacuum, the alignment restricting force can be further enhanced.

The foregoing description of the embodiment of the present invention merely illustrates an example of working out the invention. Therefore, the invention is not limited to the above-described embodiment, and the embodiment can be modified as needed without departing from the scope and spirit of the invention.

What is claimed:

1. An apparatus for forming an alignment film on a substrate using ion beam sputtering to execute (i) a film deposition process that deposits, on a first surface side of the substrate, a sputtering film having an orientation and (ii) an alignment process that forms the alignment film on the first surface side of the substrate, the apparatus comprising:

a target comprising polyimide and disposed on the first surface side of the substrate, the target having a sputtering surface defining an angle relative to the first surface side of the substrate, said target comprising a material configured to be sputtered by an ion beam propagating from an ion source toward the substrate and impinging on a sputtering surface of the target, which results in sputtered particles of the material being emitted from the sputtering surface of the target and deposited on the first surface side of the substrate to form the sputtering film on the first surface side of the substrate;

a transfer unit adapted to move the substrate linearly in a direction;

said ion source which is disposed on the first surface side of the substrate, wherein both the ion source and the ion beam face toward the first surface side of the substrate;

a mask that covers a portion of the first surface side of the substrate side on an upstream side of a position where the sputtering film is formed, wherein the mask is disposed between the substrate and both the target and the ion source, wherein the mask is separated from the substrate, and wherein the mask is solid throughout and is separated from the substrate by a constant distance throughout;

a temperature regulator to regulate a temperature of the target to be a predetermined temperature, wherein the temperature regulator is disposed on, and in direct mechanical contact with, a back surface of the target, wherein the back surface of the target is parallel to the sputtering surface of the target, wherein the back surface of the target is spatially separated from the sputtering surface of the target by a thickness of the target in a direction perpendicular to the sputtering surface of the target, wherein the temperature regulator fits on a first surface area of the back surface of the target, wherein a total surface area of the back surface of the target consists of the first surface area of the back surface of the target and a remaining surface area of the back surface of the target, and wherein the remaining surface area surrounds the first area;

a vacuum chamber in which a degree of a vacuum exists, wherein the target, the substrate, the transfer unit, the ion source, and the temperature regulator are disposed within the vacuum chamber; and the ion source configured for an acceleration voltage of about 1500 volts for accelerating the ion beam from the ion source to the sputtering surface of the target, wherein an irradiation angle ($\theta i$), formed between (i) the ion beam propagating from the ion source and (ii) the first surface side of the substrate, is less than a target angle ($\theta t$) formed between the sputtering surface of the target and the first surface side of the substrate, subject to the irradiation angle and the target angle being a first acute angle and a second acute angle, respectively, and wherein the irradiation angle ($\theta i$) is equal to or less than 45 degrees and the target angle ($\theta t$) is equal to or less than 60 degrees.

2. The apparatus of claim 1, wherein the temperature regulator comprises a heater, a temperature sensor, and a Proportional-Integral-Derivative control circuit.

3. The apparatus of claim 1, wherein the temperature regulator serves as a target holder to hold the target.

4. The apparatus of claim 1, further comprising a columnar roller rotatably provided at a bottom side of the transfer unit to enable the transfer unit to be movable lengthwise.

5. The apparatus of claim 1, wherein the irradiation angle ($\theta i$) is equal to 45 degrees and the target angle ($\theta t$) is equal to 60 degrees.

6. The apparatus of claim 1, wherein the degree of the vacuum is about $2 \times 10^{-2}$ Pa.

* * * * *